United States Patent [19]

Aslam et al.

[11] Patent Number: 5,413,668
[45] Date of Patent: May 9, 1995

[54] METHOD FOR MAKING MECHANICAL AND MICRO-ELECTROMECHANICAL DEVICES

[75] Inventors: Mohammad Aslam, Okemos, Mich.; Michael A. Tamor, Toledo, Ohio

[73] Assignee: Ford Motor Company, Dearborn, Mich.

[21] Appl. No.: 140,906

[22] Filed: Oct. 25, 1993

[51] Int. Cl.⁶ .............................................. B44C 1/22
[52] U.S. Cl. ...................................... 216/2; 437/228; 437/229; 216/48; 216/17
[58] Field of Search ............... 156/631, 625, 656, 657; 437/228, 229

[56] References Cited

U.S. PATENT DOCUMENTS

| | | | |
|---|---|---|---|
| 4,332,879 | 6/1982 | Pastor et al. | 437/229 |
| 4,604,160 | 8/1986 | Murakami et al. | 156/656 |
| 4,694,548 | 9/1987 | Ehrfeld et al. | |
| 4,770,740 | 9/1988 | Tsuzuki et al. | |
| 4,772,540 | 9/1988 | Deutsch et al. | |
| 4,882,138 | 11/1989 | Pinneo | |
| 5,075,095 | 12/1991 | Pinneo | |
| 5,116,463 | 5/1992 | Lin et al. | 156/656 |
| 5,135,606 | 8/1992 | Kato et al. | 156/656 |
| 5,137,597 | 8/1992 | Curry, II et al. | 156/656 |
| 5,180,940 | 1/1993 | Paratte et al. | |
| 5,292,558 | 3/1994 | Heller et al. | 437/229 |

FOREIGN PATENT DOCUMENTS 0078076 7/1978 Japan ................................ 156/656

OTHER PUBLICATIONS

"Techniques for Patterning of CVD Diamond Films on Non-Diamond Substrates", By A. Masood and M. Aslam, *J. Electrochem Soc.* vol. 138 No. 11, Nov. 1991.
"Applications of Diamond Films and Related Materials", By J. Michael Pinneo, *Materials Science Monographs*, 73, 1991.
"CVD Silicon Carbide Components", By P. Reagan, W. Cole and F. Huffman, *Ceram. Eng. Sci. Proc.* 8, pp. 958–967, 1987.

Primary Examiner—Olik Chaudhuri
Assistant Examiner—Long Pham
Attorney, Agent, or Firm—Lorraine S. Melotik; Roger L. May

[57] ABSTRACT

Methods for making mechanical and micro-electromechanical devices (a) forming a mold having a base and metallic walls defining a molding space therebetween, the base being exposed between the metallic walls and either being capable of or having a nucleating upper surface capable of nucleating the deposition of a structural material which does not nucleate on or adhere to the metallic walls at conditions of deposition; (b) depositing a structural material onto either the nucleating upper surface or base and filling to a predetermined height to form a strong solid body; and (c) removing the metallic walls, leaving free-standing, solid body walls of structural material attached to the base; another embodiment of the method may include step (a) and steps (b) filling the molding space with a diamond-nucleating material; (c) consolidating the diamond-nucleating material so as to form a strong solid body; and (d) removing the metallic walls, and thereby freeing the solid body, by dissolving the metallic walls with an agent, normally a liquid.

20 Claims, 4 Drawing Sheets

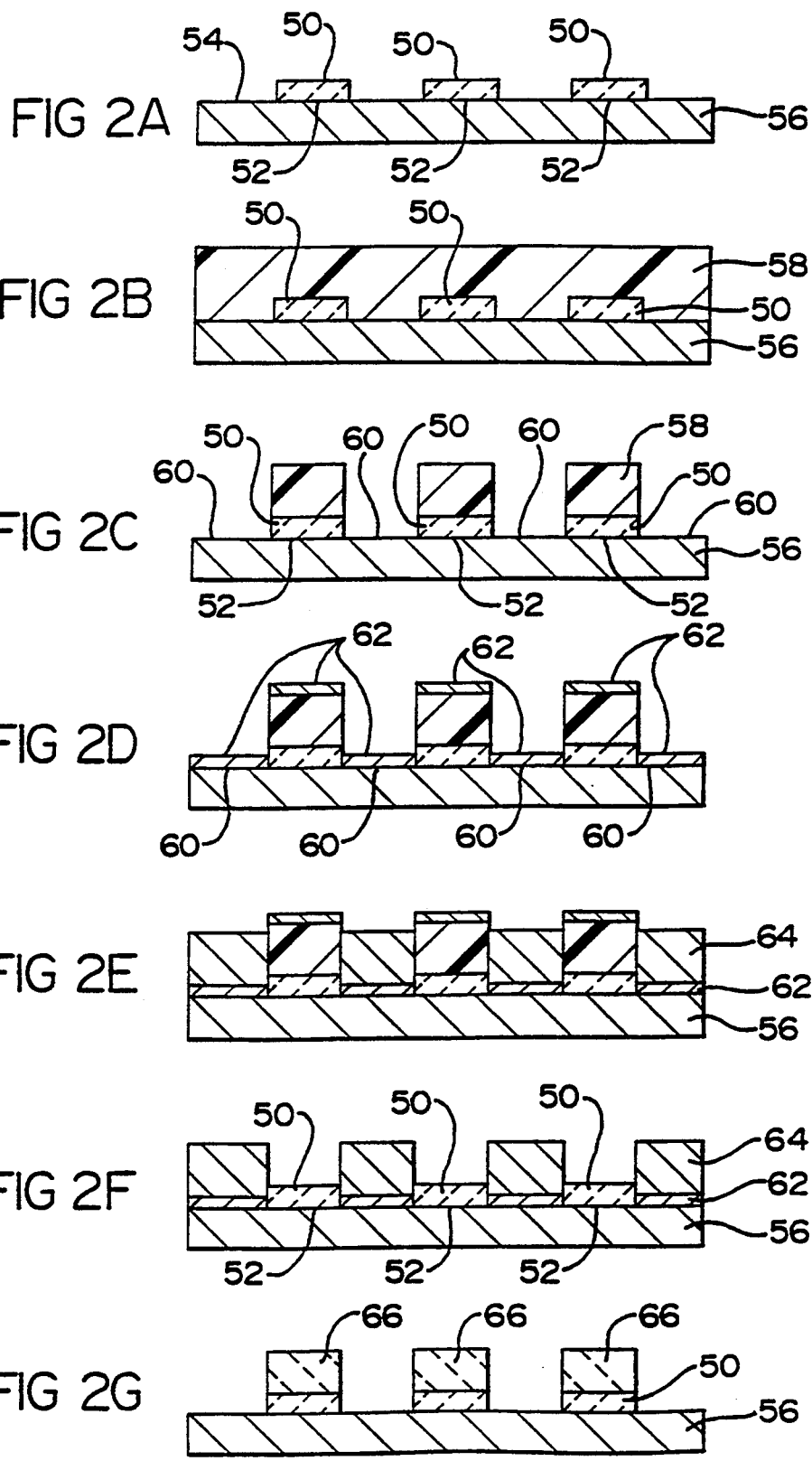

METHOD FOR MAKING MECHANICAL AND MICRO-ELECTROMECHANICAL DEVICES

BACKGROUND OF THE INVENTION

1. Field of the Invention

The present invention relates generally to methods for making mechanical devices and, more particularly, to methods for making mechanical devices and micro-electromechanical devices or systems (MEMS) using metallic molds.

2. Description of the Related Art

In the automotive industry today, greater demands are being placed on materials of construction to meet the needs of the consumer and to conform to government regulations. Mechanical and electromechanical devices in automotive vehicles are being developed that have requirements dramatically different from those of such devices currently in use. Such requirements as high strength, chemical resistance, low friction, wear-resistance, and high-temperature resistance are dictated by the ever increasing need for increased thermodynamic and mechanical efficiency and robust sensors and actuators for control systems.

Currently, many electromechanical devices are formed using silicon as the primary structural material, and MEMS are under intensive study for microsensor applications including possible automotive vehicle applications. Although materials more desirable than silicon exists - such as diamond, silicon carbide, and silicon nitride - there is a need in the art for methods for making intricately-patterned devices from such materials. In addition, there is a need in the art for a method for making devices which have the flexibility of being made electrically-conducting or electrically-insulating.

Photolithographic techniques are commonly used in making patterned mechanical and electromechanical devices. However, these techniques have been developed primarily for making metallic devices formed of, e.g., nickel or copper.

SUMMARY OF THE INVENTION

Accordingly, the present invention is a method for making mechanical devices which generally includes (a) forming a mold having a base and metallic walls defining a molding space therebetween, the base being exposed between the metallic walls and having a nucleating upper surface capable of nucleating the deposition of a structural material which does not nucleate on or adhere to the metallic walls at conditions of deposition; and (b) depositing a structural material onto the nucleating upper surface and filling to a predetermined height to form a strong solid body; and (c) removing the metallic walls, leaving free-standing, solid body walls of structural material attached to the base.

Another embodiment of the present invention is a method of making mechanical and micro-electromechanical devices which generally includes (a) forming a mold having a base and metallic walls defining a molding space therebetween, the base being exposed between the metallic walls and capable of nucleating the deposition of a structural material which does not nucleate on or adhere to the metallic walls at conditions of deposition; (b) depositing a structural material formed substantially of a material selected from a group comprised of diamond, silicon carbide, silicon nitride, and mixtures thereof onto the base and filling to a predetermined height to form a strong solid body; and (c) removing the metallic walls, leaving free-standing, solid body walls of structural material attached to the base.

Yet another embodiment of the present invention is a method for making mechanical devices which includes (a) forming a mold having a base and metallic walls defining a molding space therebetween; (b) filling the molding space with a diamond-nucleating material; (c) consolidating the diamond-nucleating material so as to form a strong solid body; and (d) removing the metallic walls, and thereby freeing the solid body, by dissolving the metallic walls with an agent, normally a liquid.

One feature of the present invention is that a method is provided for making mechanical devices and MEMS which have high strength, chemical resistance, low friction, wear-resistance, and high-temperature resistance. Another feature of the present invention is that a method is provided for making intricately-patterned mechanical devices and MEMS formed of materials, such as, diamond, silicon carbide, etc., which may be made electrically-conducting or electrically-insulating.

Other features and advantages of the present invention will be readily appreciated as the same becomes better understood after reading the subsequent description taken in conjunction with the appendant drawings.

BRIEF DESCRIPTION OF THE DRAWINGS

FIGS. 2A–2G are sectional elevational views of another embodiment of the method of making a device illustrating successive steps of the method.

DESCRIPTION OF THE PREFERRED EMBODIMENT(S)

A method, according to the present invention, is disclosed for making mechanical and micro-electromechanical devices or systems which generally includes (a) forming a mold having a base and metallic walls defining a molding space therebetween, the base being exposed between the metallic walls and having a nucleating upper surface capable of nucleating the deposition of a structural material which does not nucleate on or adhere to the metallic walls at conditions of deposition; (b) depositing a structural material onto the nucleating upper surface and filling to a predetermined height to form a strong solid body; and (c) removing the metallic walls, leaving free-standing, solid body walls of structural material attached to the base. A first embodiment of the present invention may be exemplified by specific methods, the first exemplary method represented by FIGS. 1A–1E, and the second exemplary method represented by FIGS. 2A–2G.

In the first exemplary method (FIGS. 1A–1E), the method includes the step of depositing an electrically-conducting nucleating layer 32 on an electrically-conductive substrate 30, thereby forming a nucleating upper surface on the electrically-conductive substrate 30. The electrically-conductive substrate 30 may be formed of any electrically-conductive material suitable for use in the present invention. Examples of such electrically-conductive materials include metals, such as molybdenum, and silicon doped with N-type or P-type impurities.

The electrically-conducting nucleating layer 32 acts as a seed onto which a structural material will be deposited and grow in a subsequent step of the present invention. The electrically-conducting nucleating layer 32 may be present as a continuous film or as discrete particles. Preferred materials for forming the electrically-conducting nucleating layer 32 are discussed hereinbelow.

A preferred method of depositing the electrically-conducting nucleating layer 32 includes chemical vapor deposition, physical vapor deposition, and other thin film depositing techniques. The publication "Low Pressure Metastable Growth of Diamond and Diamond-like Phases", by John C. Angus and Cliff C. Hayman, Science, Vol. 241, Aug. 19, 1988, discloses techniques of depositing diamond. It should be appreciated that diamond must be doped with a suitable material such as boron to make the diamond electrically conducting.

Figure 1A:
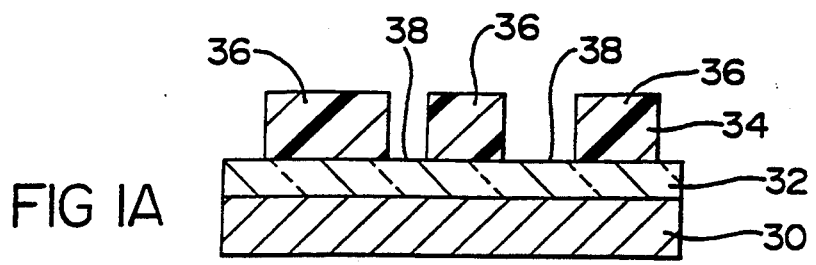
FIGS. 1A–1E are sectional elevational views of a method of making a device, according to the present invention, illustrating successive steps of the method.

After the electrically-conducting nucleating layer 32 has been deposited onto the electrically-conductive substrate 30, photolithographic techniques are used to form a patterned layer of radiation-sensitive material 34 on the electrically-conducting nucleating layer 32 as illustrated in FIG. 1A. U.S. Pat. No. 4,694,548, discloses photolithographic techniques useful in the present invention, the disclosure of which is hereby incorporated by reference.

The photolithographic technique begins with applying a layer of radiation-sensitive material onto the electrically-conducting nucleating layer 32. The radiation-sensitive material may be positive or negative resist material and may be based on materials, such as, polyamide or polymethylmethacrylate. The radiation-sensitive material may be applied by any suitable method, such as flow coating, roller coating, or dip coating or a self-supporting sheet of the radiation-sensitive material may be prepared and laminated onto the electrically-conducting nucleating layer 32 while tacky and/or by the application of heat and pressure. Alternatively, a thin adhesive layer may be coated onto the electrically-conducting nucleating layer 32 and, thereafter, a self-supporting layer of radiation-sensitive material applied to the adhesive layer. The layer of radiation-sensitive material may be several microns thick, depending on the desired final structure of the mechanical device.

Once a layer of radiation-sensitive material has been applied onto the electrically-conducting nucleating layer 32, the layer of radiation-sensitive material is masked with a masking structure having the desired pattern. The masking structure may be composed of, e.g., about sixteen (16) microns of gold which is essentially impermeable to X-ray radiation. Optionally, the masking structure may be carried on a mask substrate which is substantially permeable to X-ray radiation, such as a substrate of beryllium in sheet formand having a thickness of approximately twenty (20) microns.

The layer of radiation-sensitive material masked with the masking structure is then irradiated with high energy radiation, that is, radiation which is actinic with respect to the radiation-sensitive material. A preferred high energy radiation is X-ray radiation if the relief structures have a height on the order of four hundred (400) microns. It should be appreciated that optical lithography can also be used instead of x-ray lithography if the relief structures have a height less than sixty (60) microns.

If the radiation-sensitive material is positive resist material, the radiation-sensitive material exposed to the radiation, i.e., not masked, is soluble in a developer which selectively dissolves the radiated radiation-sensitive material and does not dissolve the non-radiated radiation-sensitive material. If the radiation-sensitive material is negative resist material, the radiation-sensitive material exposed to the radiation is insoluble in the developer and the radiation-sensitive material not exposed to radiation is soluble in the developer.

Developer is then used to dissolve the soluble portion of the radiation-sensitive material, thereby forming a pattern of radiation-sensitive material 34 having walls 36 and selected portions removed in which first areas 38 of the electrically-conducting nucleating layer 32 are exposed.

Figure 1B:
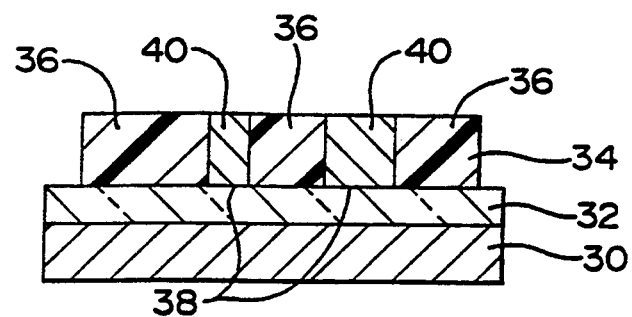

As illustrated in FIG. 1B, a metal layer 40 of a metal that can withstand diamond growth conditions such as copper is then deposited between the walls 36 of the radiation-sensitive material and onto the exposed first areas 38 of the electrically-conducting nucleating layer 32. The metal layer 40 may be deposited by electrodeposition in which the electrically-conductive substrate 30 and the electrically-conducting nucleating layer 32 together serve as an electrode during the electrodeposition.

Figure 1C:
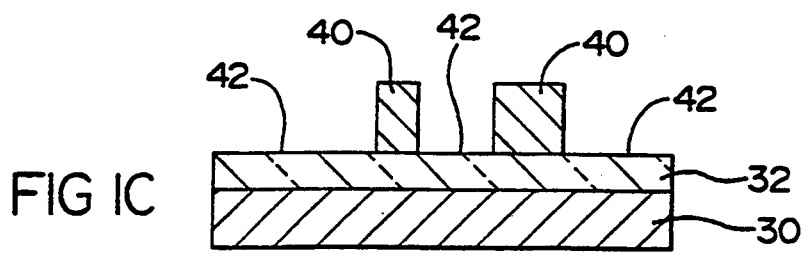

Once the metal layer 40 has been deposited to the exposed first areas 38 of the electrically-conducting nucleating layer 32, the walls 36 of radiation-sensitive material are then removed, such as by chemically dissolving them in a liquid stripper bath having a composition which dissolves the walls 36 of the radiation-sensitive material. Removing the walls 36 of the radiation-sensitive material leaves the metal layer 40 in the form of free-standing walls and exposes second areas 42 of the electrically-conducting nucleating layer 32 as illustrated in FIG. 1C.

Figure 1D:
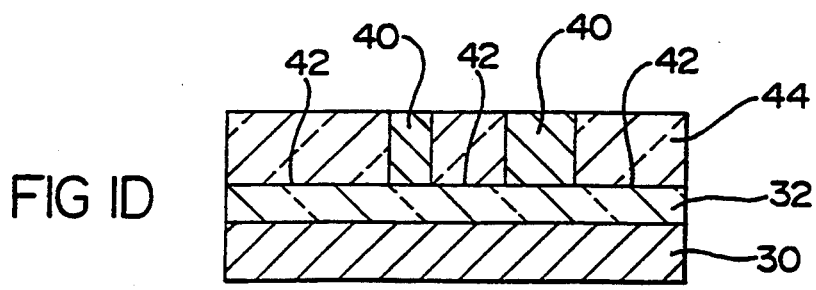

Once the free-standing walls of the metal layer 40 are formed, a layer of structural material 44 is deposited onto the exposed second areas 42 of the electrically-conducting nucleating layer 32, the result of which step is illustrated in FIG. 1D. The layer of structural material 44 may be deposited by methods such as by chemical vapor deposition, physical vapor deposition, or other thin film depositing techniques as previously described.

The structural material 44 is preferably a material which does not nucleate on or adhere to the free-standing walls of the metal layer 40 at temperature and pressure conditions of deposition. Typically, for chemical vapor deposition, chemical vapor infiltration, and vapor consolidation, the operating pressure is from $10^{-3}$ to $10^3$ torr and the operating temperature is from 20° to 1000° C. It is undesirable to have the structural material 44 nucleate on or adhere to the top of the free-standing walls of the metal layer 40 as these walls may be subsequently removed. Preferably, the structural material 44 is substantially diamond. The term "substantially" is used herein to mean at least seventy (70) volume percent. An example of a structural material 44 which does not nucleate on or adhere to a metal layer 40 such as copper at such conditions is diamond. It should be appreciated that the structural material 44 and metal layer 40 are two materials that do not nucleate on or adhere to each other.

The structural material 44 may be formed of electrically-conducting material, such as, diamond, silicon carbide, etc. which has been made electrically-conducting. Using electrically-conducting material for the structural material 44 is useful in forming electrically-conducting paths in the mechanical device for forming micro-electromechanical devices or systems, such as, motors. In addition, the deposited structural material 44 can alternate between electrically-conducting and electrically-insulating layers, as desired.

To provide a good surface for depositing the structural material 44 thereon, it is preferred that the electrically-conducting nucleating layer 32 be formed of electrically-conducting diamond, electrically-conducting silicon carbide, electrically-conducting silicon nitride, or mixtures thereof. Preferably, the material of the electrically-conducting nucleating layer 32 is conducting diamond.

To render the diamond, silicon carbide, or silicon nitride electrically-conducting, the material may be doped with N-type or P-type impurities, e.g., boron for P-type doping of diamond or silicon carbide. The material forming the electrically-conducting nucleating layer 32 should be doped with enough N-type or P-type impurities to allow electroplating of the metal thereon.

Figure 1E:
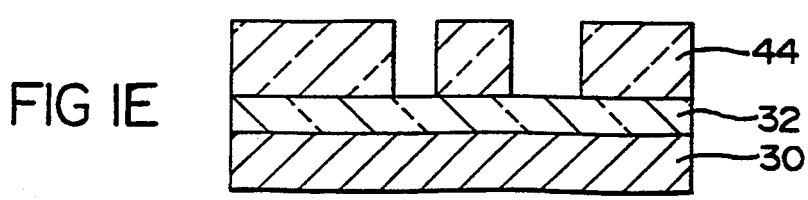

After deposition of the layer of structural material 44, the free-standing walls of the metal layer 40 may be removed from the device leaving free-standing walls of structural material 44 attached to the electrically-conducting nucleating layer 32. The metal may be removed by an agent, for example, by dissolving the copper with an acid which dissolves copper, e.g., sulfuric acid. The final device made by this exemplary method is illustrated in FIG. 1E.

The second exemplary method of the present invention is illustrated in FIGS. 2A–2G. The method begins with patterning a nucleating layer 50 onto first regions 52 of an upper surface 54 of a substrate 56 as illustrated in FIG. 2A. The patterning may be accomplished by suitable techniques such as selective nucleation and patterned etching as disclosed in the publication "Techniques for Patterning of CVD Diamond Films on Non-Diamond Substrates", by A. Masood et al., J. Electrochem. Soc., Vol 138, No. 11, November 1991, which publication is hereby incorporated by reference. The nucleating layer 50 is formed of any material which is capable of nucleating the structural material to be deposited in a later step. The nucleating layer 50 may be present as a continuous film or as discrete particles. Depositing the nucleating layer 50 may be done by any suitable technique, such as chemical vapor deposition, physical vapor deposition or other thin film depositing techniques as discussed hereinabove. The substrate 56 may be formed of any electrically-conductive material which can withstand the temperature and pressure conditions of the present method, such as silicon doped with N-type or P-type impurities.

Once the nucleating layer 50 has been deposited on the substrate 56, photolithographic techniques are then used to develop a pattern of radiation-sensitive material on the substrate 56. The principles of photolithographic techniques discussed above apply for this exemplary method, also. To form a pattern of radiation-sensitive material, a layer of radiation-sensitive material 58 is applied onto the upper surface 54 of the substrate 56 which includes the first regions 52 having the nucleating layer 50 thereon and regions without nucleating material thereon as illustrated in FIG. 2B.

Selected portions of the layer of radiation-sensitive material 58 are then removed to expose second regions 60 of the upper surface 54 of the substrate 56, leaving portions of the layer of radiation-sensitive material 58 over the first regions 52 of the substrate 56 as illustrated in FIG. 2C.

A metal such as copper 62 is then deposited onto the exposed second regions 60 to a height which is less than the height of the layer of radiation-sensitive material 58. The copper 62 may be deposited by first sputtering a layer of copper onto the exposed second regions 60. Using this technique of depositing copper, copper will also be deposited on top of the radiation-sensitive material 58 as illustrated in FIG. 2D.

A metal layer such as a copper layer 64 may then be deposited on the sputtered copper 62 in contact with the substrate 56 using electrodeposition techniques. Using electrodeposition, copper will not deposit onto the sputtered layer 62 on top of the radiation-sensitive material 58, as the radiation-sensitive material 58 is formed of insulating material. The result after electrodepositing the copper is illustrated in FIG. 2E.

Once the desired amount of copper has been deposited, the remaining portions of the radiation-sensitive material 58 are then removed, leaving free-standing copper walls and exposed first regions 52 of the substrate 56 having the nucleating layer 50 deposited thereon as illustrated in FIG. 2F. A layer of structural material 66 is then deposited onto the nucleating layer 50. The layer of structural material 66 may be deposited by techniques, such as chemical vapor deposition, physical vapor deposition, and other thin film depositing techniques as discussed hereinabove. The structural material 66 is preferably any material which does not nucleate on or adhere to copper at the temperature and pressure conditions of the deposition of the structural material. The nucleating layer 50 and the layer of structural material 66 may be formed substantially of a material such as diamond, silicon carbide and mixtures thereof.

After the desired height of the layer of structural material 66 has been deposited, the copper walls may be removed by dissolving them with acid. The resulting mechanical device, after removing the copper walls, is illustrated in FIG. 2G having walls of structural material 66,50 attached to substrate 56.

A second embodiment, according to the present invention, generally concerns a method of making mechanical and micro-electromechanical devices which generally includes (a) forming a mold having a base and metallic walls defining a molding space therebetween, the base being exposed between the metallic walls and capable of nucleating the deposition of a structural material which does not nucleate on or adhere to the metallic walls at conditions of deposition; (b) depositing a structural material formed substantially of a material selected from a group comprised of diamond, silicon carbide, silicon nitride, and mixtures thereof onto the base and filling to a predetermined height to form a strong solid body; and (c) removing the metallic walls, leaving free-standing, solid body walls of structural material attached to the base.

Figure 3A:
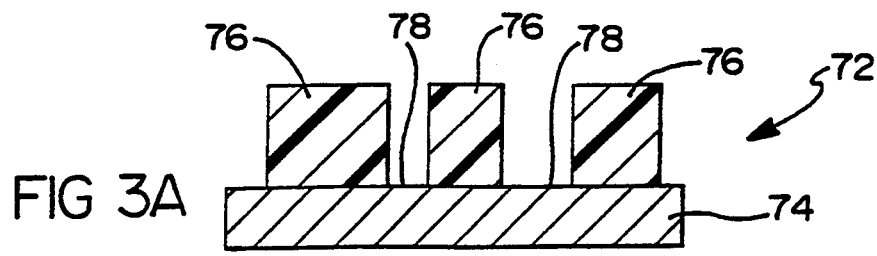
FIGS. 3A–3E are sectional elevational views of yet another embodiment of the method of making a device illustrating successive steps of the method.

Referring to FIG. 3A, the method includes a step of forming a mold, generally indicated at 72, having a base or floor 74 of an electrically-conductive material as previously described. The mold 72 also has walls 76 patterned on the base 74. The walls 76 are formed of a mixture of electrically-conducting nucleating material and radiation-sensitive material. The mixture may be diamond powder dispersed in the radiation-sensitive material and deposited on the base 74. Alternatively, the mixture may be a thin layer deposited on the base 74 and a thicker layer of radiation-sensitive material alone deposited thereon. The mixture is patterned by photolithographic techniques as previously described.

Figure 3B:
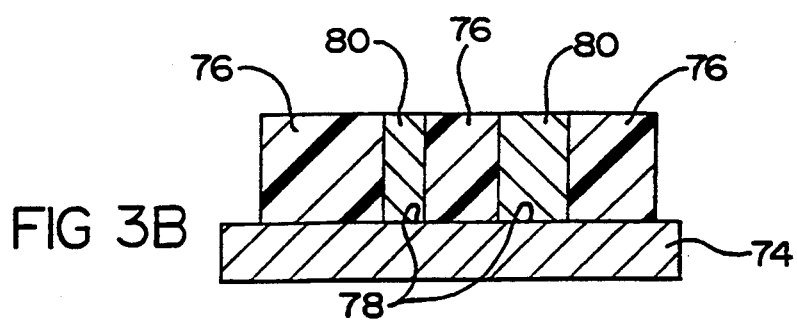
Figure 3C:
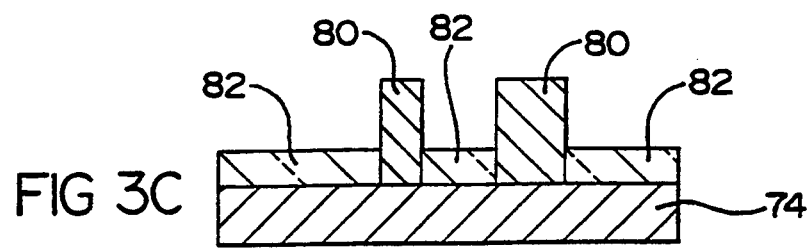

As illustrated in FIG. 3B, the space between the base 74 and the walls 76 is deposited with a metal layer 80 of a metal material such as copper onto exposed areas 78 of the base 74 by electrodeposition as previously described. Once the metal layer 80 has been deposited, the walls 76 are then removed by heating to a predetermined temperature such as 900° C. to evaporate the radiation-sensitive material and leave deposits 82 of nucleating material as illustrated in FIG. 3C.

Figure 3D:
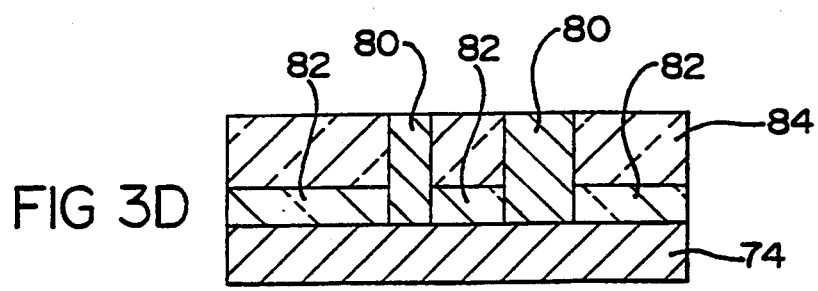

Simultaneously, a layer of structural material 84 is deposited onto the deposits 82 of nucleating material, the result of which step is illustrated in FIG. 3D. The layer of structural material 84 may be deposited by methods such as chemical vapor deposition, etc. as previously described.

Figure 3E:
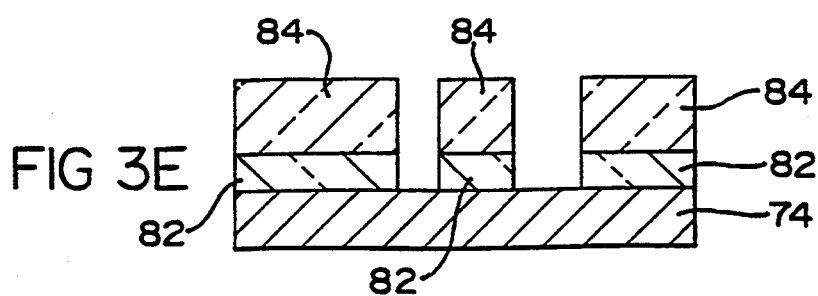

After deposition of the structural material 84, the free-standing walls of the metal layer 80 may be removed from the device, thereby leaving free-standing solid body walls of structural material 84 attached to the deposits 82 and base 74. The metal layer 80 may be removed by an agent as previously described. The final device made by this exemplary method is illustrated in FIG. 3E.

A third embodiment, according to the present invention, generally concerns a method of making mechanical and micro-electromechanical devices which generally includes (a) forming a mold having a base and metallic walls defining a molding space therebetween; (b) filling the molding space with a diamond-nucleating material; (c) consolidating the diamond-nucleating material so as to form a strong solid body; and (d) removing the metallic walls, and thereby freeing the solid body, by dissolving the metallic walls with an agent, normally a liquid.

Figure 4A:
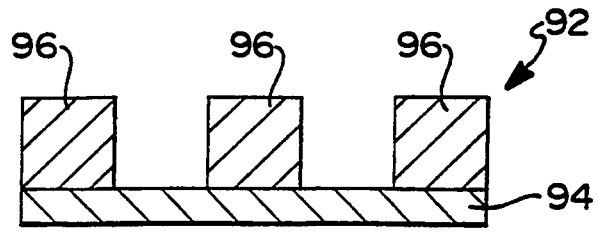
FIGS. 4A–4D are sectional elevational views of still another embodiment of the method of making a device illustrating successive steps of the method.
Figure 4B:
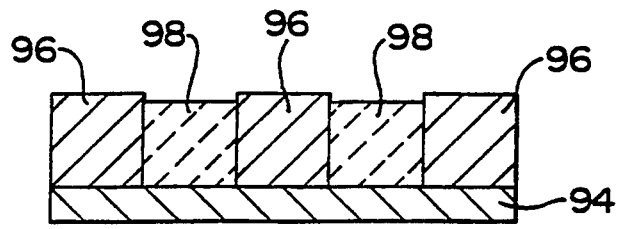

Turning now to the drawings and in particular FIG. 4A, the method includes the step of forming a mold, generally indicated at 92, having a base or floor 94 and metallic walls 96. The mold 92 may be formed in any suitable manner. The space between the floor 94 and the metallic walls 96 is at least partially filled with diamond-nucleating material 98 as illustrated in FIG. 4B. The diamond-nucleating material 98 may be any powder on which diamond readily nucleates, such as diamond powder, silicon carbide powder, boron nitride powder, and mixtures thereof.

Figure 4C:
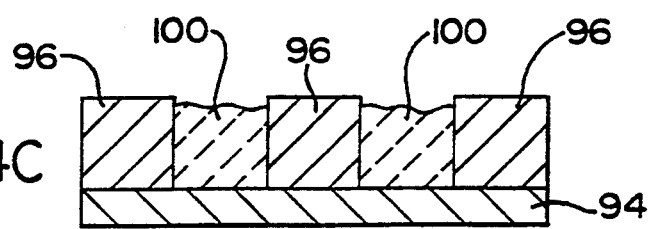

The diamond-nucleating material 98 is consolidated so as to form a strong solid body of deposited diamond 100 as illustrated in FIG. 4C. Methods for nucleating and consolidating diamond onto diamond-nucleating material may be found in U.S. Pat. Nos. 4,882,138 and 5,075,095, the disclosures of which are hereby incorporated by reference. The publication, "Applications of Diamond Films and Related Materials", from the proceedings of the First International Conference on the Applications of Diamond Films and Related Materials, Auburn, Ala., Aug. 17-22, 1991, discloses a chemical vapor infiltration method, which publication is hereby incorporated by reference.

Figure 4D:
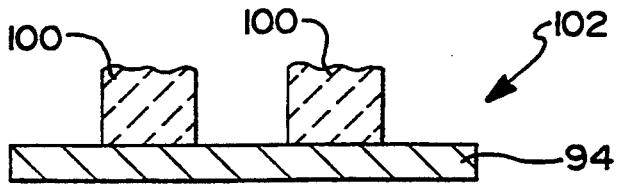

The metallic walls 96 are then removed by dissolving them with an agent, normally a liquid, such as an acid, leaving or freeing the solid body device, generally indicated at 102, which has deposited diamond 100, (present as free-standing walls) attached to the floor 94 as illustrated in FIG. 4D.

The floor 94 may be formed of any material which can withstand the temperature and pressure conditions for nucleating and consolidating the diamond, such as 400°–1000° C. and 10–100 torr. The metallic walls 96 may be formed of any metallic material which can withstand the temperature and pressure conditions for nucleating and consolidating the diamond, such as nickel or chrome. Preferably, the metallic walls 96 are formed of an electroplatable metal. The floor 94 should be formed of a material which will not dissolve with the liquid used to dissolve the metallic walls 96.

Accordingly, the method for making mechanical devices and micro-electromechanical devices or systems includes materials which exhibit high strength, chemical resistance, low friction, wear-resistance, and high-temperature resistance. The present invention provides a new material technology for MEMS.

The present invention has been described in an illustrative manner. It is to be understood that the terminology which has been used is intended to be in the nature of words of description rather than of limitation.

Many modifications and variations of the present invention are possible in light of the above teachings. Therefore, within the scope of the appended claims, the present invention may be practiced otherwise than as specifically described.

What is claimed is:

1. A method for making mechanical and micro-electromechanical devices comprising the steps of:
    forming a mold having a base and metallic walls defining a molding space therebetween, the base being exposed between the metallic walls and having a nucleating upper surface to nucleate a structural material deposited thereon which does not nucleate on or adhere to the metallic walls; and
    depositing a structural material onto the nucleating upper surface and filling to a predetermined height to form a strong solid body.

2. A method as set forth in claim 1 wherein the nucleating upper surface is formed at least seventy percent volume of a material selected from a group comprised of diamond, silicon carbide, silicon nitride, and mixtures thereof.

3. A method as set forth in claim 1 wherein the structural material is at least seventy percent volume a material selected from a group comprising of diamond, silicon carbide, silicon nitride, and mixtures thereof.

4. A method as set forth in claim 1 wherein depositing the structural material is accomplished by a technique selected from a group comprising of chemical vapor deposition and physical vapor deposition.

5. A method for making mechanical and micro-electromechanical devices comprising the steps of:
    depositing an electrically-conducting nucleating layer on an electrically-conductive substrate, thereby forming a nucleating upper surface;
    applying a layer of radiation-sensitive material onto the electrically-conducting nucleating layer;
    removing selected portions of the layer of radiation-sensitive material to expose first areas of the electrically-conducting nucleating layer;
    electrodepositing metal onto the first areas of the electrically-conducting nucleating layer;
    removing the remaining portions of the radiation-sensitive material, leaving free-standing metallic walls and exposed second areas of the electrically-conducting nucleating layer; and depositing a structural material onto the electrically-conducting nucleating layer and filling to a predetermined height to form a stronq solid body.

6. A method for making mechanical and micro-electromechanical devices comprising the steps of:

depositing a nucleating layer onto first regions of the upper surface of a substrate, thereby forming a nucleating upper surface;

applying a layer of radiation-sensitive material onto the upper surface of the substrate which includes first regions having the nucleating layer deposited thereon and regions without the nucleating layer deposited thereon;

removing selected portions of the layer of radiation-sensitive material to expose second regions of the upper surface of the substrate, leaving portions of the layer of radiation-sensitive material over the first regions of the upper surface of the substrate;

depositing metal onto the exposed second regions to a height which is less than the height of the layer of radiation-sensitive material;

removing the remaining portions of the radiation-sensitive material, leaving free-standing metallic walls and exposed first regions of the upper surface of the substrate having the nucleating layer deposited thereon; and depositing a structural material onto the upper surface and filling to a predetermined height to form a stronq solid body.

7. A method as set forth in claim 6 wherein the metal is deposited by sputtering a layer of copper onto the exposed second regions and, thereafter, electrodepositing copper onto the sputtered layer.

8. A method as set forth in claim 1 further comprising, after the step of depositing the structural material, the step of removing the metal walls, leaving free-standing walls of structural material attached to the base.

9. A method as set forth in claim 8 wherein removing the metal walls is accomplished by dissolving the metal walls with an agent.

10. A method for making mechanical and micro-electromechanical devices comprising the steps of:

forming a mold having metallic walls and a base defining a molding space therebetween, the base being exposed between the metallic walls and nucleating a structural material deposited thereon which does not nucleate on or adhere to the metallic walls;

depositing a structural material formed at least seventy volume percent of a material selected from a group comprised of diamond, silicon carbide, silicon nitride, and mixtures thereof onto the base and filling to a predetermined height to form a strong solid body;

removing the metallic walls, leaving free-standing, solid body walls of structural material attached to the base.

11. A method as set forth in claim 10 wherein depositing the structural material is accomplished by either chemical vapor deposition or physical vapor deposition.

12. A method as set Eorth in claim 10 wherein removing the metallic walls is accomplished by dissolving the metallic walls with acid.

13. A method for making mechanical and micro-electromechanical devices comprising the steps of:

depositing an electrically-conducting nucleating layer on an electrically-conductive substrate, thereby forming a nucleating upper surface;

applying a layer of radiation-sensitive material onto the electrically-conducting nucleating layer;

removing selected portions of the layer of radiation-sensitive material to expose first areas of the electrically-conducting nucleating layer;

electrodepositing copper onto the first areas of the electrically-conducting nucleating layer;

removing the remaining portions of the radiation-sensitive material, leaving free-standing copper walls and exposed second areas of the electrically-conducting nucleating layer; and depositing a structural material formed at least seventy volume percent of a material selected from a group comprised of diamond, silicon carbide, silicon nitride, and mixtures thereof onto the base and filling to a predetermined height to form a strong solid body; and removing the metallic walls, leaving free-standing, solid body walls of structural material attached to the base.

14. A method for making mechanical and micro-electromechanical devices comprising the steps of:

patterning a nucleating layer onto first regions of the upper surface of a substrate;

applying a layer of radiation-sensitive material onto the upper surface of the substrate which includes first regions having the nucleating layer deposited thereon and regions without the nucleating layer deposited thereon;

removing selected portions of the layer of radiation-sensitive material to expose second regions of the upper surface of the substrate, leaving portions of the layer of radiation-sensitive material over the first regions of the upper surface of the substrate;

depositing copper onto the exposed second regions to a height which is less than the height of the layer of radiation-sensitive material;

removing the remaining portions of the radiation-sensitive material, leaving free-standing copper walls and exposed first regions of the upper surface of the substrate having the nucleating layer deposited thereon;

depositing a structural material formed at least seventy volume percent of a material selected from a group comprised of diamond, silicon carbide, silicon nitride, and mixtures thereof onto the base and filling to a predetermined height to form a strong solid body; and removing the metallic walls, leaving free-standing, solid body walls of structural material attached to the base.

15. A method as set forth in claim 10 wherein the step of forming the mold comprises:

patterning a layer of nucleating material and radiation-sensitive material on an upper surface of the substrate to form exposed areas;

electrodepositing a metal material onto the exposed areas; and heating the metal material and patterned layer and substrate to remove the radiation-sensitive material and leave deposits of nucleating material.

16. A method for making mechanical and micro-electromechanical devices comprising the steps of:

depositing an electrically-conducting nucleating layer on an electrically-conductive substrate forming a nucleating upper surface thereon, the nucleating layer formed at least seventy volume percent of a material selected from a group comprised of diamond, silicon carbide, silicon nitride, and mixtures thereof, applying a layer of radiation-sensitive material onto the electrically-conducting nucleating layer;

removing selected portions of the layer of radiation-sensitive material to expose first areas of the electrically-conducting nucleating layer;

electrodepositing copper onto the first areas of the electrically-conducting nucleating layer;

removing the remaining portions of the radiation-sensitive material, leaving free-standing walls of copper and exposed second areas of the electrically-conducting nucleating layer;

depositing structural material formed at least seventy volume percent of a material selected from a group comprised of diamond, silicon carbide, silicon nitride, and mixtures thereof onto the exposed second areas of the electrically-conducting nucleating layer and filling to a predetermined height to form a strong solid body; and removing the copper walls, leaving free-standing solid body walls of structural material attached to the substrate.

17. A method for making mechanical and micro-electromechanical devices comprising the steps of:

depositing a nucleating layer formed at least seventy volume percent of a material selected from a group comprised of diamond, silicon carbide, silicon nitride, and mixtures thereof onto first regions of the upper surface of a substrate, thereby forming a nucleating upper surface;

applying a layer of radiation-sensitive material onto the upper surface of the substrate which includes first regions having the nucleating layer deposited thereon and regions without the nucleating layer deposited thereon;

removing selected portions of the layer of radiation-sensitive material to expose second regions of the upper surface of the substrate, leaving portions of the layer of radiation-sensitive material over the first regions of the upper surface;

depositing copper onto the exposed second regions to a height which is less than the height of the layer of radiation-sensitive material; and removing the remaining portions of the radiation-sensitive material, leaving free-standing copper walls and exposed first regions of the upper surface of the substrate having the nucleating layer deposited thereon;

depositing a structural material formed at least seventy volume percent. of a material selected from a group comprised of diamond, silicon carbide, silicon nitride, and mixtures thereof onto the exposed first regions and filling to a predetermined height to form a strong solid body; and removing the copper walls, leaving free-standing solid body walls of structural material attached to the substrate.

18. A method as set forth in claim 17 wherein the copper is deposited by sputtering a layer of copper onto the exposed second regions and, thereafter, electrodepositing copper onto the sputtered layer.

19. A method for making mechanical and micro-electromechanical devices comprising the steps of:

forming a mold having a base and metallic walls defining a molding space therebetween;

filling the molding space with a diamond-nucleating material;

consolidating the diamond-nucleating material so as to form a strong solid body; and removing the metallic walls, and thereby freeing the solid body, by dissolving the metallic walls with an agent.

20. A method as set forth in claim 19 wherein the agent which dissolves the metallic walls contains acid.

* * * * *